US012776358B2

(12) United States Patent
Hattori et al.

(10) Patent No.: US 12,776,358 B2
(45) Date of Patent: Oct. 27, 2026

(54) DIFFERENTIAL AMPLIFIER OFFSET IN MEMORY

(71) Applicant: Micron Technology, Inc., Boise, ID (US)

(72) Inventors: Yasuko Hattori, Folsom, CA (US); Shuai Xu, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 72 days.

(21) Appl. No.: 18/791,004

(22) Filed: Jul. 31, 2024

(65) Prior Publication Data

US 2025/0273254 A1 Aug. 28, 2025

Related U.S. Application Data

(60) Provisional application No. 63/558,372, filed on Feb. 27, 2024.

(51) Int. Cl.
*G11C 11/22* (2006.01)

(52) U.S. Cl.
CPC ...... *G11C 11/2273* (2013.01); *G11C 11/2259* (2013.01)

(58) Field of Classification Search
CPC .................................................. G11C 11/2273
See application file for complete search history.

(56) References Cited

U.S. PATENT DOCUMENTS 6,574,135 B1 * 6/2003 Komatsuzaki ........... G11C 7/06 365/210.12
10,446,232 B2 10/2019 Di Vincenzo et al.
10,504,576 B2 12/2019 Vimercati
2001/0026469 A1 10/2001 Schlosser et al.
2002/0039309 A1 * 4/2002 Lu .......................... G11C 11/15 365/158
2014/0328134 A1 * 11/2014 Vimercati ................ G11C 7/12 365/203

FOREIGN PATENT DOCUMENTS

WO WO2022038347 A1 * 2/2022

* cited by examiner

*Primary Examiner* — Amir Zarabian
*Assistant Examiner* — Anthony Thinh Tang
(74) *Attorney, Agent, or Firm* — Brooks, Cameron & Huebsch, PLLC

(57) ABSTRACT

The present disclosure includes apparatuses, methods, and systems for differential amplifier offset in memory. An embodiment includes an array of memory cells, a differential amplifier having a first input and a second input, wherein the first input is connectable to a target voltage, and a capacitor coupled to the second input and configured to store an offset of the differential amplifier. The differential amplifier is configured to, during an operation to sense a data state of a memory cell of the array, reconnect the first input and the second input.

19 Claims, 5 Drawing Sheets

DIFFERENTIAL AMPLIFIER OFFSET IN MEMORY

PRIORITY INFORMATION

This application claims the benefit of U.S. Provisional Application No. 63/558,372, filed on Feb. 27, 2024, the contents of which are incorporated herein by reference.

TECHNICAL FIELD

The present disclosure relates generally to semiconductor memory and methods, and more particularly, to differential amplifier offset in memory.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), ferroelectric random-access memory (FeRAM), resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Memory devices can include memory cells that can store data based on the charge level of a storage element (e.g., a capacitor). Such memory cells can be programmed to store data corresponding to a target data state by varying the charge level of the storage element (e.g., different levels of charge of the capacitor may represent different data sates). For example, sources of an electrical field or energy, such as positive or negative electrical pulses (e.g., positive or negative voltage or current pulses), can be applied to the memory cell (e.g., to the storage element of the cell) for a particular duration to program the cell to a target data state.

A memory cell can be programmed to one of a number of data states. For example, a single level memory cell (SLC) can be programmed to a targeted one of two different data states, which can be represented by the binary units 1 or 0 and can depend on whether the capacitor of the cell is charged or uncharged. As an additional example, some memory cells can be programmed to a targeted one of more than two data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs can provide higher density memories without increasing the number of memory cells since each cell can represent more than one digit (e.g., more than one bit).

DETAILED DESCRIPTION

Figure 1A:
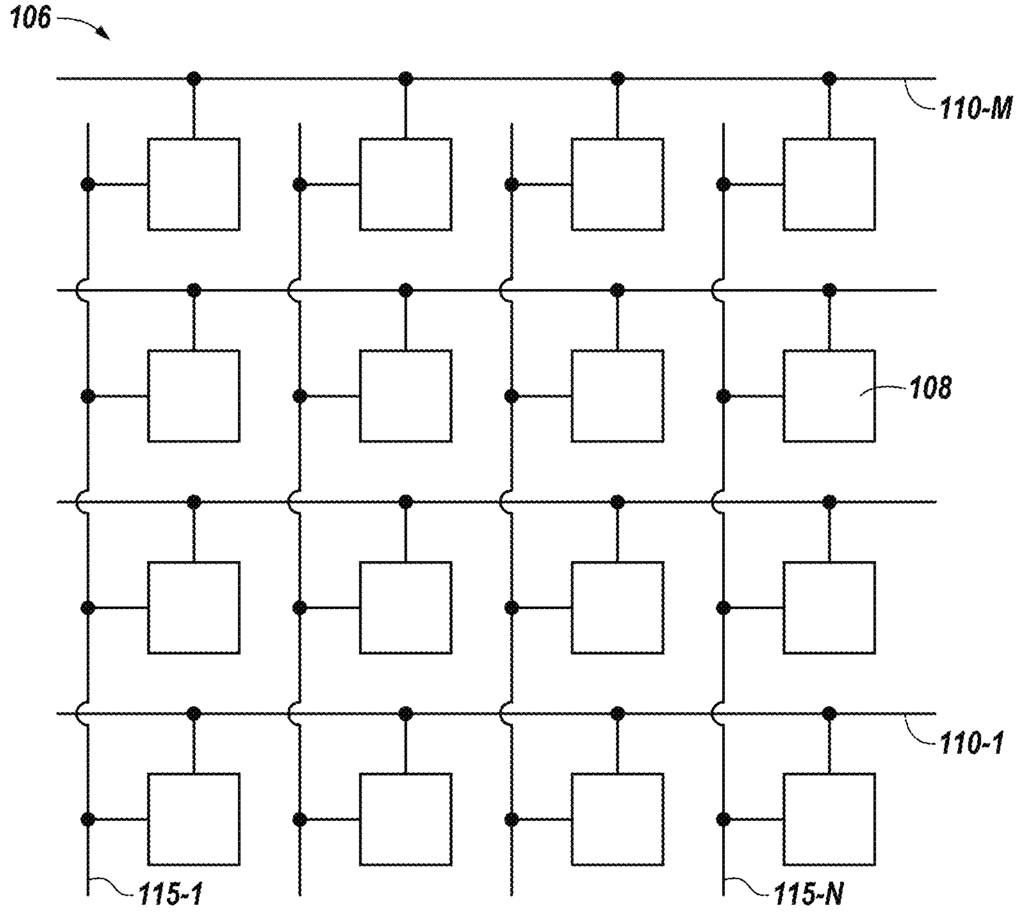
FIG. 1A illustrates an example of a memory array in accordance with an embodiment of the present disclosure.

The present disclosure includes apparatuses, methods, and systems for differential amplifier offset in memory. An embodiment includes an array of memory cells, a differential amplifier having a first input and a second input, wherein the first input is connectable to a target voltage, and a capacitor coupled to the second input and configured to store an offset of the differential amplifier. The differential amplifier is configured to, during an operation to sense a data state of a memory cell of the array, reconnect the first input and the second input.

During the sensing of a memory cell, such as an FeRAM cell, a voltage (e.g., a read voltage) may be applied to a data (e.g., digit) line coupled to the memory cell, and the data state of the cell can be determined based on the amount of current that flows through the cell in response to the applied voltage. For instance, the amount of current that flows through the cell in response to the applied read voltage can correspond to the polarization state of the ferroelectric material of the memory cell, which in turn can correspond to the data state of the cell.

The data state of a memory cell (e.g., an FeRAM cell) can be sensed by utilizing a differential amplifier with a feedback loop that provides a desired (e.g., target) voltage to the differential amplifier. However, in some instances, the feedback loop may not provide (e.g., feedback) the desired target voltage to the amplifier due to, for example, the electrical characteristics (e.g., the inherent resistance and/or capacitance) of the digit line.

In previous approaches, such an offset between the desired target voltage and the actual voltage input into the differential amplifier by the feedback loop may be compensated for by pre-charging the digit line prior to sensing the data state of the memory cell. However, the amount of time needed to pre-charge the digit line to compensate for (e.g., cancel) the offset can be long, which can increase the amount of time needed to sense the data state of the memory cell.

Embodiments of the present disclosure, however, can reduce and/or eliminate the pre-charge time by storing an offset of the differential amplifier (e.g., the opposite of the offset to the target voltage caused by the electrical characteristics of the digit line) that can be used to cancel the offset to the target voltage caused by the electrical characteristics of the digit line. Accordingly, embodiments of the present disclosure can decrease the amount of time needed to sense the data state of memory cells, and therefore increase the performance of the memory, as compared to previous approaches.

As used herein, "a" or "an" can refer to one or more of something, and "a plurality of" can refer to more than one of such things. For example, a memory cell can refer to one or more memory cells, and a plurality of memory cells can refer to two or more memory cells. Additionally, the designators "M" and "N" as used herein, particularly with respect to reference numerals in the drawings, indicates that one or more of the particular feature so designated can be included with embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 106 may reference element "06" in FIGS. 1A and 1B, and a similar element may be referenced as 406 in FIG. 4.

FIG. 1A illustrates an example of a memory array 106 in accordance with an embodiment of the present disclosure. Memory array 106 can be, for example, a ferroelectric memory (e.g., FeRAM) array.

As shown in FIG. 1A, memory array 106 may include memory cells 108 that may be programmable to store different states. Memory cells 108 can be, for example, FeRAM cells. A memory cell (e.g., a FeRAM cell) 108 may include a capacitor to store a charge representative of the programmable states. For example, a charged and uncharged capacitor may respectively represent two logic states (e.g. 0 and 1). A memory cell 108 may include a capacitor with a ferroelectric material, such as, for instance, an oxide material such as lead zirconate titanate (PZT) in some examples. For example, ferroelectric materials may have a non-linear relationship between an applied electric field and stored charge (e.g., in the form of a hysteresis loop), and may have a spontaneous electric polarization (e.g., a non-zero polarization in the absence of an electric field). Different levels of charge of a ferroelectric capacitor may represent different logic states, for example.

As shown in FIG. 1A, a memory cell 108 may be coupled to a respective access line, such as a respective one of access lines 110-1 to 110-M, and a respective data (e.g., digit) line, such as one of data lines 115-1 to 115-N. For example, a memory cell 108 may be coupled between an access line 110 and a data line 115. In an example, access lines 110 may also be referred to as word lines, and data lines 115 may also be referred to as bit lines. Access lines 110 and data lines 115, for example, may be made of conductive materials, such as copper, aluminum, gold, tungsten, etc., metal alloys, other conductive materials, or the like.

In an example, memory cells 108 commonly coupled to an access line 110 may be referred to as a row of memory cells. For example, access lines 110 may be coupled to a row decoder (not shown in FIG. 1A), and data lines 115 may be coupled to a column decoder (not shown in FIG. 1A). Operations such as programming (e.g., writing) and sensing (e.g., reading) may be performed on memory cells 108 by activating or selecting the appropriate access line 110 and a data line 115 (e.g., by applying a voltage to the access line). Activating an access line 110 may electrically couple the corresponding row of memory cells 108 to their respective data lines 115.

Although not shown in FIG. 1A for clarity and so as not to obscure embodiments of the present disclosure, memory array 106 can be included in an apparatus in the form of a memory device. As used herein, an "apparatus" can refer to, but is not limited to, any of a variety of structures or combinations of structures, such as a circuit or circuitry, a die or dice, a module or modules, a device or devices, or a system or systems, for example. Further, the apparatus (e.g., memory device) may include an additional memory array(s) analogous to array 106.

Figure 1B:
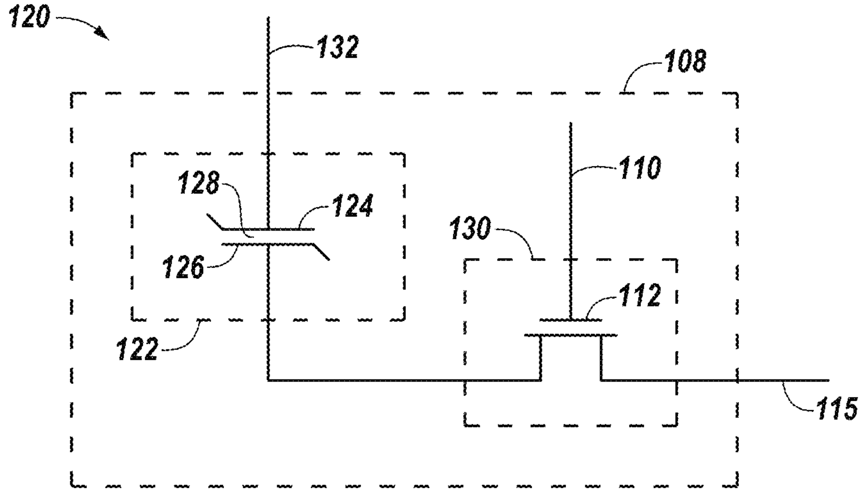
FIG. 1B illustrates an example of a memory cell in accordance with an embodiment of the present disclosure.

FIG. 1B illustrates an example circuit 120 that includes a memory cell 108 in accordance with an embodiment of the present disclosure. As shown in FIG. 1B, circuit 120 may include a memory (e.g., FeRAM) cell 108, an access line 110, and a data line 115 that may respectively be examples of a memory cell 108, an access line 110, and a data line 115, shown in FIG. 1A.

As shown in FIG. 1B, memory cell 108 may include a storage element, such as a capacitor 122, that may have a first plate, such as a cell plate 124, and a second plate, such as a cell bottom 126. Cell plate 124 and cell bottom 126 may be capacitively coupled through a ferroelectric material 128 positioned between them. The orientation of cell plate 124 and cell bottom 126 may be flipped without changing the operation of memory cell 108.

As shown in FIG. 1B, circuit 120 may include a select device 130, such as a select transistor. For example, the control gate 112 of select device 130 may be coupled to access line 110. In the example of FIG. 1B, cell plate 124 may be accessed via plate line 132, and cell bottom 126 may be accessed via data line 115. For example, select device 130 may be used to selectively couple data line 115 to cell bottom 126 in response to access line 110 activating select device 130. For example, capacitor 122 may be electrically isolated from data line 115 when select device 130 is deactivated, and capacitor 122 may be electrically coupled to data line 115 when select device 130 is activated. Activating select device 130 may be referred to as selecting memory cell 108, for example.

In an example, sources of an electric field, such as positive or negative electrical pulses (e.g., positive or negative voltage or current pulses), can be applied to the storage element of memory cell 108 (e.g., to capacitor 122) for a particular duration to program the cell to a target data state. For instance, when the electric field (e.g., the electrical pulses) is applied across the ferroelectric material 128 of capacitor 122, the dipoles of ferroelectric material 128 may align in the direction of the applied electric field. The dipoles may retain their alignment (e.g., polarization state) after the electric field is removed, and different logic states (e.g., 0 and 1) may be stored as the different polarization states of the ferroelectric material 128. Accordingly, memory cell 108 may be programmed by charging cell plate 124 and cell bottom 126, which may apply an electric field across ferroelectric material 128 and place the ferroelectric material in a particular polarization state (e.g., depending on the polarity of the applied field) that may correspond to a particular data (e.g., logic) state. The data state of the memory cell may subsequently be determined (e.g., sensed) by determining which polarization state the ferroelectric material is in.

For example, when a sensing (e.g., read) voltage is applied to the memory cell (e.g., during a sense operation being performed on the cell), current may flow through, and be output by, the memory cell in response to the sensing voltage being applied to the cell. This current can correspond to the amount of charge discharged by the memory cell (e.g. by the capacitor of the memory cell) while the sensing voltage is being applied to the memory cell. As such, the data state of the memory cell can be determined based on the amount of current output by the memory cell (e.g., the amount of charge discharged by the memory cell) while the sensing voltage is being applied to the memory cell For instance, the current output by the memory cell may be a first (e.g., low) amount if the memory cell has been programmed to a first data state (e.g., 1) corresponding to a first polarization state of the ferroelectric material of the memory cell, and the current output by the memory cell may be a second (e.g., high and/or greater) amount if the memory cell has been programmed to a second data state (e.g., 0) corresponding to a second polarization state of the ferroelectric material of the memory cell. The data state of the memory cell can be sensed by utilizing a differential amplifier, as will be further described herein.

Figure 2A:
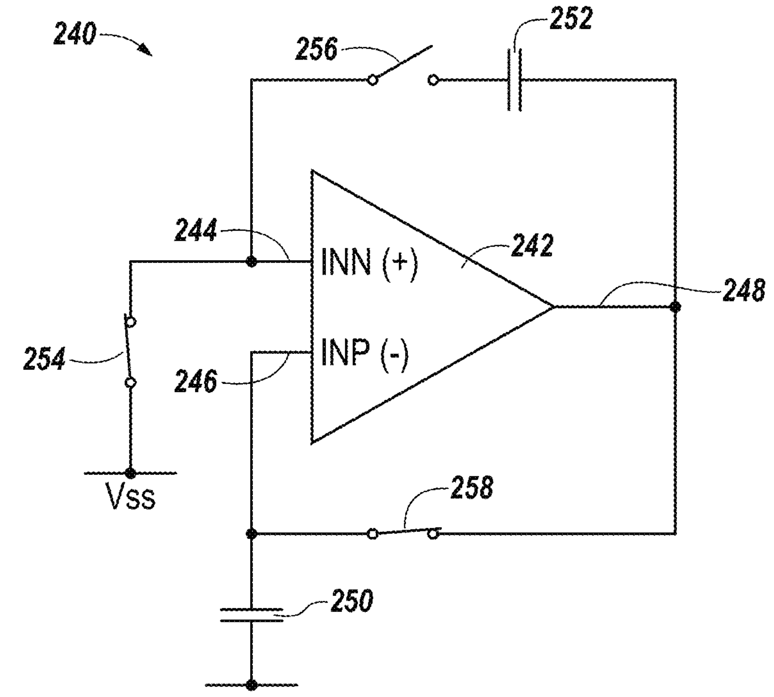
FIGS. 2A-2B illustrate an example of circuitry used to sense a data state of a memory cell in accordance with an embodiment of the present disclosure.
Figure 2B:
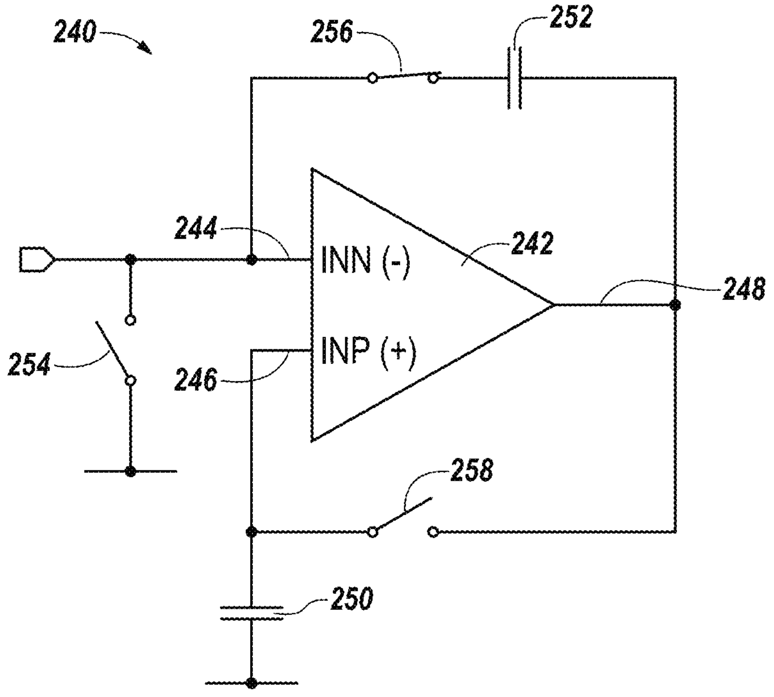

FIGS. 2A-2B illustrate an example of circuitry 240 used to sense a data state of a memory cell in accordance with an embodiment of the present disclosure. For instance, FIG. 2A illustrates circuitry 240 prior to an operation (e.g., a sense operation) to sense (e.g., read) the data state of the memory cell (e.g., during pre-charge), and FIG. 2B illustrates circuitry 240 during the operation to sense the data state of the memory cell. The memory cell can be, for example, an FeRAM cell, such as memory cell 108 previously described in connection with FIGS. 1A-1B. For instance, circuitry 240 can be coupled to, and included in, the same apparatus (e.g., memory device) as memory array 106 previously described in connection with FIGS. 1A-1B. That is, circuitry 240 can be coupled to an array that includes memory cells that are analogous to memory cells 108.

Further, although not shown in FIGS. 2A-2B for simplicity and so as not to obscure embodiments of the present disclosure, circuitry 240 can be coupled to a controller that can be used to operate circuitry 240 prior to and during the operation to sense the data state of the memory cell. The controller can include, for example, control circuitry and/or logic (e.g., hardware and/or firmware), and can be included on the same physical device (e.g., the same die) as the memory array, or can be included on a separate physical device that is communicatively coupled to the physical device that includes the memory array. In an embodiment, components of the controller can be spread across multiple physical devices (e.g., some components on the same die as the array, and some components on a different die, module, or board). An example of such a controller will be further described herein (e.g., in connection with FIG. 4).

As shown in FIGS. 2A-2B, circuitry 240 can include a differential amplifier 242 having a first input (INN) 244, a second input (INP) 246, and an output 248. First input 244 is connectable to a target voltage (Vss) via a switch 254, as illustrated in FIGS. 2A-2B. For instance, in FIG. 2A (e.g., prior to the operation to sense the data state of the memory cell), first input 244 is connected to the target voltage via switch 254 (e.g., switch 254 is closed) such that first input 244 is forced to the target voltage, and in FIG. 2B (e.g., during the operation to sense the data state of the memory cell), first input 244 is disconnected from the target voltage (e.g., switch 254 is open). The target voltage can be a constant voltage (e.g., a constant voltage supply).

As shown in FIGS. 2A-2B, circuitry 240 can include a capacitor 250 coupled to second input 246 of differential amplifier 242. Capacitor 250 can store an offset of differential amplifier 242. The offset can be, for example, the opposite of the offset to the target voltage (Vss) caused by the electrical characteristics (e.g., the inherent resistance and/or capacitance) of the data (e.g., digit) line to which the memory cell is coupled.

Capacitor 250 is connectable to output 248 of differential amplifier 242 via a switch 258, as illustrated in FIGS. 2A-2B. For instance, in FIG. 2A (e.g., prior to the operation to sense the data state of the memory cell), capacitor 250 is connected to output 248 via switch 258 (e.g., switch 258 is closed) such that the offset of differential amplifier 242 is stored on second input 246, and in FIG. 2B (e.g., during the operation to sense the data state of the memory cell), capacitor 250 is disconnected from output 248 (e.g., switch 258 is open).

As shown in FIGS. 2A-2B, circuitry 240 can include a capacitor 252 coupled to output 248 of differential amplifier 242. Further, capacitor 252 is connectable to first input 244 of differential amplifier 242 via a switch 256, as illustrated in FIGS. 2A-2B. For instance, in FIG. 2A (e.g., prior to the operation to sense the data state of the memory cell), capacitor 252 is disconnected from first input 244 (e.g., switch 256 is open), and in FIG. 2B (e.g., during the operation to sense the data state of the memory cell), capacitor 252 is connected to first input 244 via switch 256 (e.g., switch 256 is closed). Capacitor 252 and switch 256 can comprise a feedback path (e.g., feedback loop) for differential amplifier 242, and the charge of capacitor 252 (e.g., whether capacitor 252 gains or loses charge) during the operation can indicate the data state of the memory cell.

Although not shown in FIGS. 2A-2B for simplicity and so as not to obscure embodiments of the present disclosure, output 248 of differential amplifier 242 can be connectable to a data (e.g., digit) line which the memory cell is coupled to through capacitance 252. The data line can be, for instance, data line 115 previously described in connection with FIGS. 1A-1B.

During the operation to sense the data state of the memory cell, first input 244 and second input 246 of differential amplifier 242 can be reconnected. For example, first input 244 can be switched from a noninverting (+) input to an inverting (−) input, and second input 246 can be switched from an inverting (−) input to a noninverting (+) input, as illustrated in FIGS. 2A-2B. First input 244 and second input 246 can be reconnected, for example, by switching a connection of transistors of differential amplifier 242, as will be further described herein (e.g., in connection with FIGS. 3A-3B).

Reconnecting the first input 244 and second input 246 can cause the offset of differential amplifier 242 to appear in the opposite direction, which can be used to cancel the offset to the target voltage caused by the electrical characteristics of the digit line to which the memory cell is coupled. For example, reconnecting the first input 244 and second input 246 can input the target voltage (Vss) to first input 244 (e.g., drive first input 244 to the target voltage) through capacitor 252 (e.g., through the feedback path) without the offset of differential amplifier 242. Meanwhile, the offset of the differential amplifier 242 can be input to second input 246 for use as a reference during the operation.

Although not shown in FIGS. 2A-2B for simplicity and so as not to obscure embodiments of the present disclosure, the memory device can include circuitry analogous to circuitry 240 for each respective data line of the memory array. For example, the memory device can include a number of additional differential amplifiers analogous to differential amplifier 242, with the output of each respective additional differential amplifier analogous to output 248 and indirectly connectable to a different data line of the array through capacitance 252. Each respective additional differential amplifier can also have a first input and second input analogous to first input 244 and second input 246, respectively. For instance, the first input of each respective additional differential amplifier can be connectable to the target voltage via a switch analogous to switch 254. Further, the second input of each respective additional differential amplifier can be coupled to a capacitor analogous to capacitor 250 (e.g., a capacitor that stores an offset of that differential amplifier and is connectable to the output of that differential amplifier via a switch analogous to switch 258). Further, an additional capacitor analogous to capacitor 252 can be coupled to the output of each respective additional differential amplifier and connectable to the first input of each respective additional differential amplifier via a switch analogous to switch 256. During an operation to sense a data state of a memory cell coupled to the data line that is coupled to the output of each respective additional differential amplifier, the first input and second input of that additional differential amplifier can be reconnected in a manner analogous to that described for first input 244 and second input 246.

Figure 3A:
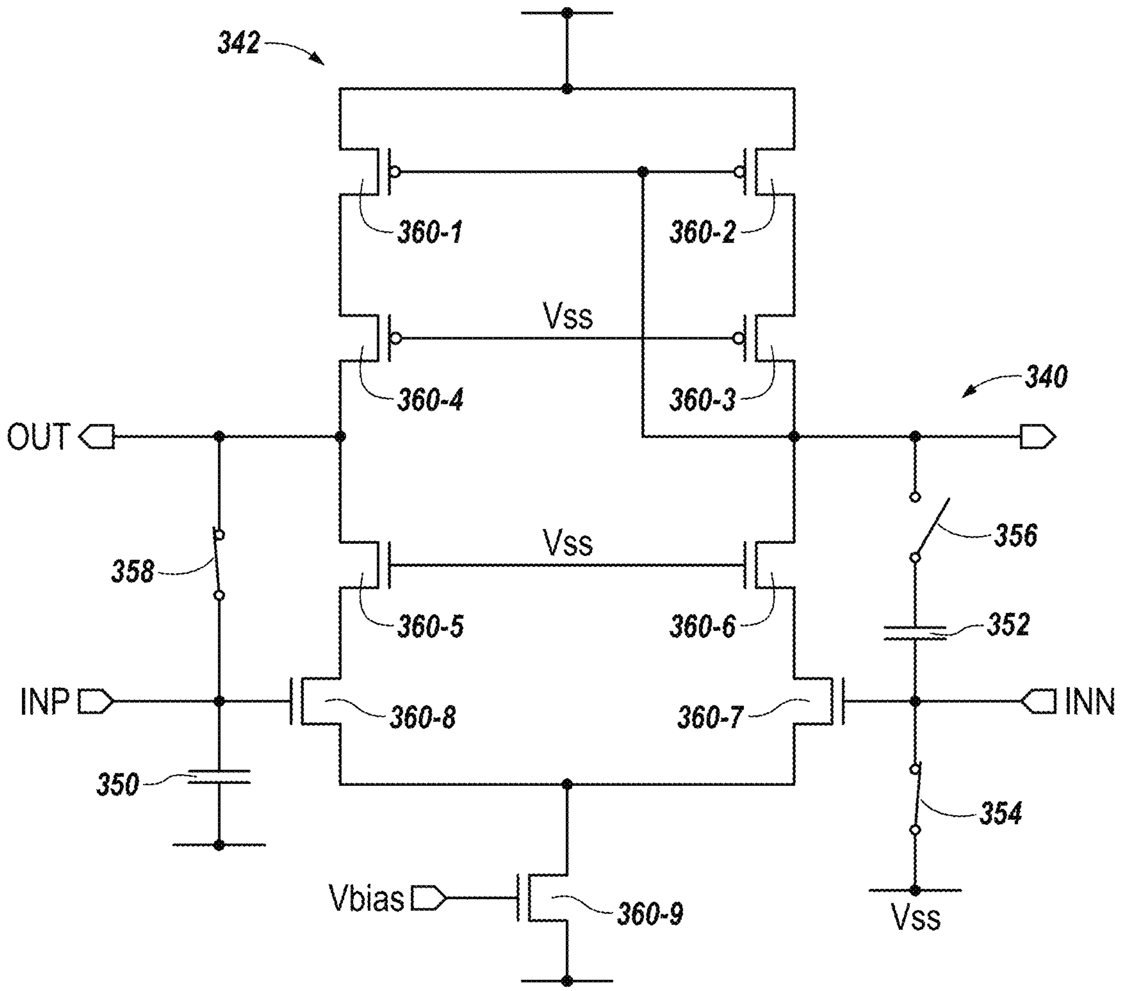
FIGS. 3A-3B illustrate an example of circuitry used to sense a data state of a memory cell in accordance with an embodiment of the present disclosure.
Figure 3B:
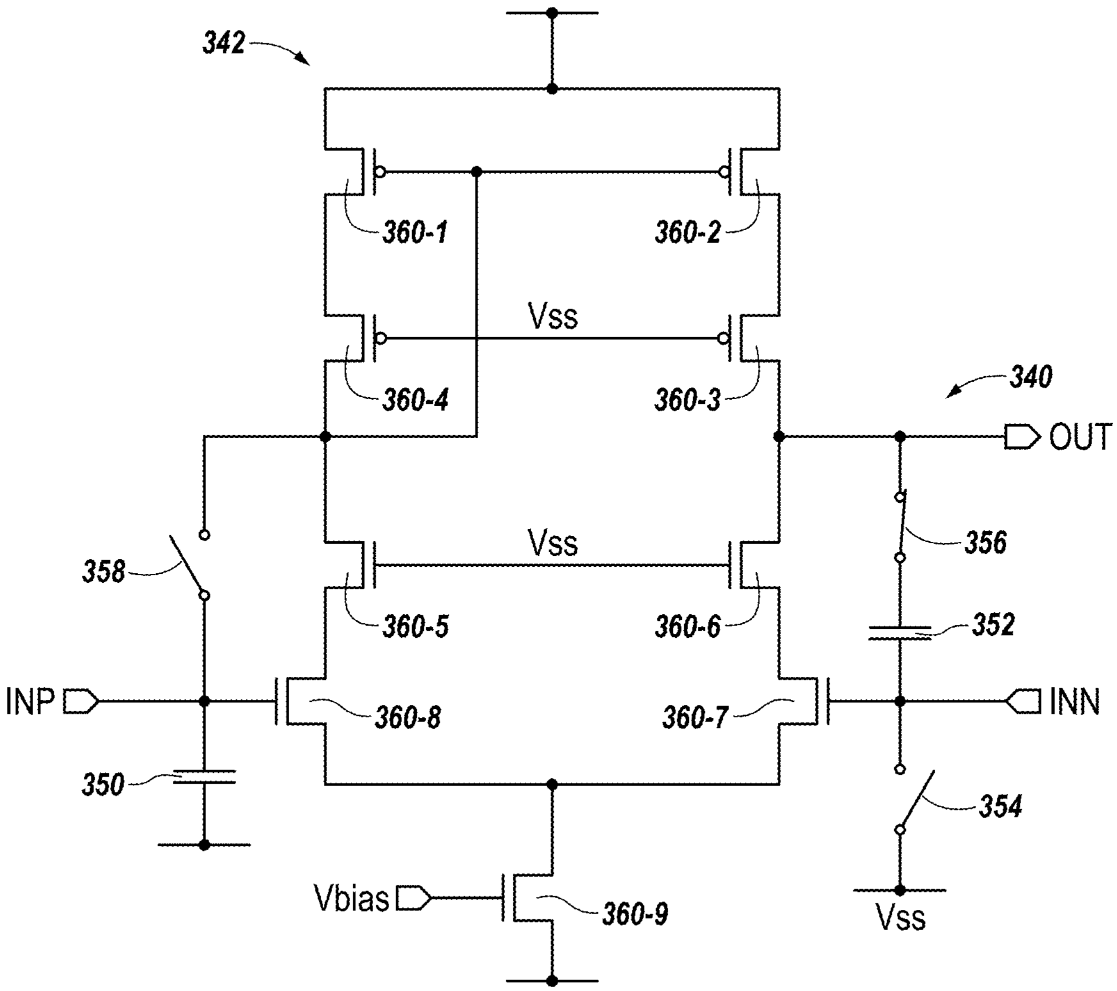

FIGS. 3A-3B illustrate an example of circuitry 340 used to sense a data state of a memory cell in accordance with an embodiment of the present disclosure. For instance, FIG. 3A illustrates circuitry 340 prior to an operation (e.g., a sense operation) to sense (e.g., read) the data state of the memory cell (e.g., during pre-charge), and FIG. 3B illustrates circuitry 340 during the operation to sense the data state of the memory cell.

Circuitry 340 can be, for example, circuitry 240 previously described in connection with FIGS. 2A-2B. For instance, as illustrated in FIGS. 3A-3B, circuitry 340 can include a differential amplifier 342, capacitors 350 and 352, and switches 354, 356, and 358 analogous to differential amplifier 242, capacitors 250 and 252, and switches 254, 256, and 258, respectively, described in connection with FIGS. 2A-2B. Further, differential amplifier 342 can include inputs INN and INP analogous to inputs INN and INP described in connection with FIGS. 2A-2B.

Capacitor 350 can store an offset of differential amplifier 342, as previously described in connection with FIGS. 2A-2B, and can be connected to the output of differential amplifier 342 via switch 358 prior to the operation to sense the data state of the memory cell, as illustrated in FIG. 3A. Further, the target voltage (Vss) previously described in connection with FIGS. 2A-2B can be connected to input INN of differential amplifier 342 via switch 354 prior to the operation to sense the data state of the memory cell, as illustrated in FIG. 3A. During the operation to sense the data state of the memory cell, capacitor 352 can be connected to the output of differential amplifier 342 via switch 356, as illustrated in FIG. 3B.

As shown in FIGS. 3A-3B, differential amplifier 342 can include a number of transistors 360-1, 360-2, . . . , 360-9 (which may collectively be referred to herein as transistors 360). For instance, differential amplifier 342 can include p-channel metal-oxide-semiconductor field-effect transistors (MOSFETs) 360-1, 360-2, 360-3, and 360-4, and n-channel MOSFETs 360-5, 360-6, 360-7, 360-8, and 360-9, as illustrated in FIGS. 2A-2B.

As shown in FIGS. 3A-3B, the gate of transistor 360-1 can be connected to the gate of transistor 360-2, the gate of transistor 360-3 can be connected to the gate of transistor 360-4, and the gate of transistor 360-5 can be connected to the gate of transistor 360-6, with the target voltage (Vss) previously described in connection with FIGS. 2A-2B provided to the connection of the gates of transistors 360-3 and 360-4 and the connection of the gates of transistors 360-5 and 360-6. Further, the source of transistor 360-1 can be connected to the source of transistor 360-2, the drain of transistor 360-1 can be connected to the source of transistor 360-4, the drain of transistor 360-2 can be connected to the source of transistor 360-3, the drain of transistor 360-3 can be connected to the drain of transistor 360-6, the drain of transistor 360-4 can be connected to the drain of transistor 360-5, the source of transistor 360-5 can be connected to the drain of transistor 360-8, the source of transistor 360-6 can be connected to the drain of transistor 360-7, and the sources of transistors 360-7 and 360-8 can be connected to the drain of transistor 360-9, as illustrated in FIGS. 3A and 3B.

As shown in FIGS. 3A-3B, input INN of differential amplifier 342 can be connected to the gate of transistor 360-7, input INP of differential amplifier 342 can be connected to the gate of transistor 360-8, and a bias voltage (Vbias) can be provided (e.g. applied) to the gate of transistor 360-9. Further, the drains of transistors 360-4 and 360-5 can be connectable to capacitor 350 via switch 358 (e.g., connected to capacitor 350 prior to the operation to sense the data state of the memory cell, as illustrated in FIG. 3A, and disconnected from capacitor 350 during the operation to sense the data state of the memory cell, as illustrated in FIG. 3B). Further, the drains of transistors 360-3 and 360-6 can be connectable to capacitor 352 via switch 356 (e.g., disconnected from capacitor 352 prior to the operation to sense the data state of the memory cell, as illustrated in FIG. 3A, and connected to capacitor 352 during the operation to sense the data state of the memory cell, as illustrated in FIG. 3B).

In the example illustrated in FIG. 3A (e.g., prior to the operation to sense the data state of the memory cell) the gates of transistors 360-1 and 360-2 can be connected to the drains of transistors 360-3 and 360-6. During the operation to sense the data state of the memory cell, the inputs INN and INP of differential amplifier 242 can be reconnected, as previously described in connection with FIGS. 2A-2B. For example, the inputs can be reconnected by switching the connection of the gates of transistors 360-1 and 360-2 from the drains of transistors 360-3 and 360-6 to the drains of transistors 360-4 and 360-5, as illustrated in FIG. 3B. Reconnecting the inputs can drive input INN to the target voltage (Vss) without the offset of differential amplifier 342, as previously described in connection with FIGS. 2A-2B. Meanwhile, the offset of the differential amplifier 342 can be input to input INP for use as a reference during the operation, as previously described in connection with FIGS. 2A-2B.

Figure 4:
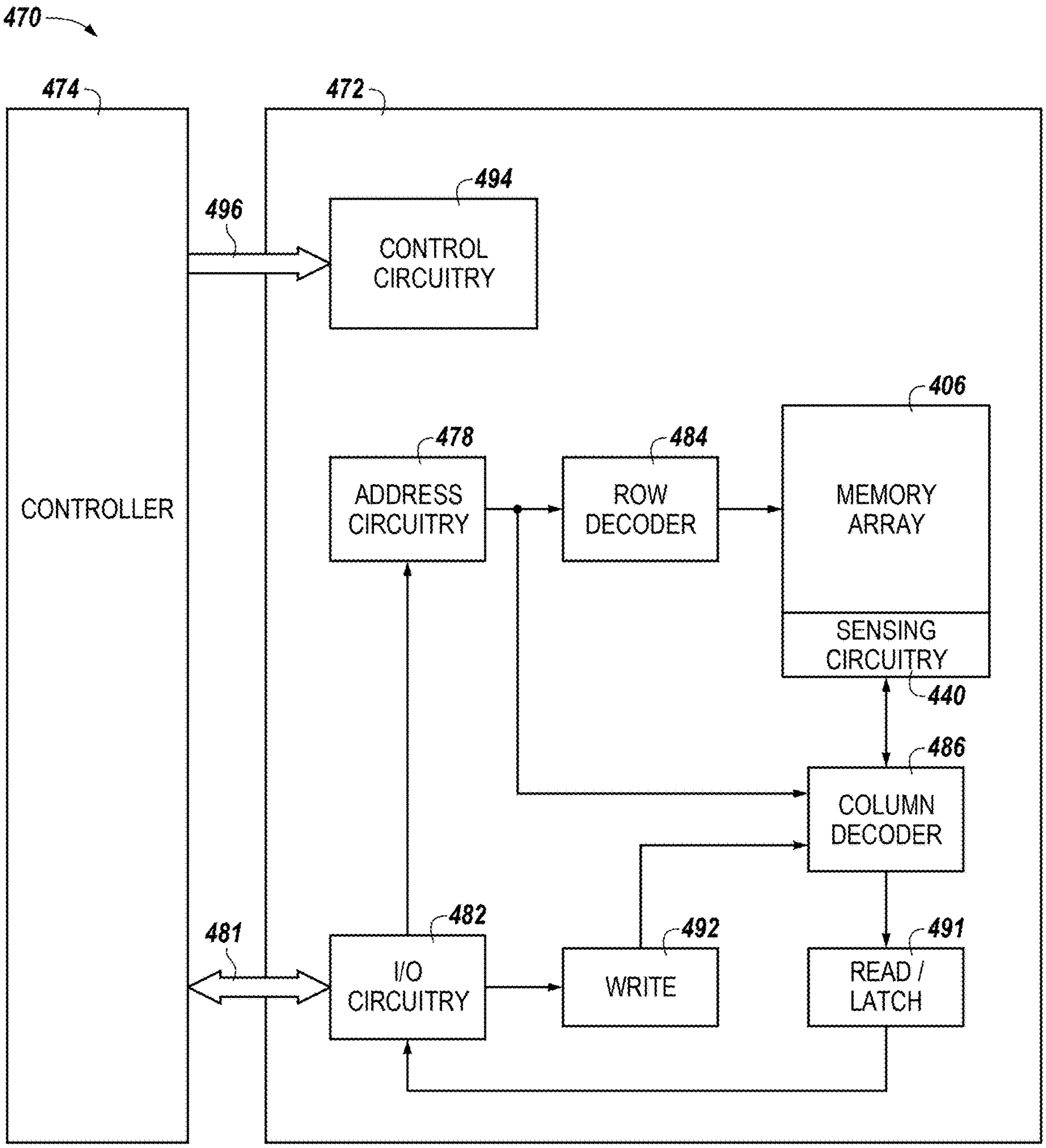
FIG. 4 is a block diagram illustration of an example apparatus in accordance with an embodiment of the present disclosure.

FIG. 4 is a block diagram illustration of an example apparatus, such as an electronic memory system 470, in accordance with an embodiment of the present disclosure. Memory system 470 may include an apparatus, such as a memory device 472 and a controller 474, such as a memory controller (e.g., a host controller). Controller 474 might include a processor, for example. Controller 474 might be coupled to a host, for example, and may receive command signals (or commands), address signals (or addresses), and data signals (or data) from the host and may output data to the host.

Memory device 472 includes a memory array 406 of memory cells. Memory array 406 can be an array of FeRAM cells, such as, for instance, memory array 106 previously described in connection with FIGS. 1A-1B. Although one memory array 406 is illustrated in FIG. 4 for simplicity and so as not to obscure embodiments of the present disclosure, memory device 472 can include a number of memory arrays analogous to array 406.

Memory device 472 may include address circuitry 478 to latch address signals provided over I/O connections 481 through I/O circuitry 482. Address signals may be received and decoded by a row decoder 484 and a column decoder 486 to access the memory array 406. For example, row decoder 484 and/or column decoder 486 may include drivers.

Controller 474 may sense (e.g., read) data in memory array 406 by using read/latch circuitry 491 and/or sensing circuitry 440. Read/latch circuitry 491 may read and latch data from the memory array 406. Sensing circuitry 440 can be, for example, circuitry 240 and/or 340 previously described in connection with FIGS. 2A-2B and 3A-3B, respectively. For example, sensing circuitry 440 may include a number of differential amplifiers coupled to memory cells of memory array 406, which may operate in combination with the read/latch circuitry 491 to sense (e.g., read) memory states from targeted memory cells. I/O circuitry 482 may be included for bi-directional data communication over the I/O connections 481 with controller 474. Write circuitry 492 may be included to program (e.g., write) data to memory array 406 (e.g., to the memory cells of the array).

Control circuitry 494 may decode signals provided by control connections 496 from controller 474. These signals may include chip signals, write enable signals, and address latch signals that are used to control the operations on memory array 406, including data read and data write operations. Control circuitry 494 may be included in controller 474, for example. Controller 474 may include other circuitry, firmware, software, or the like, whether alone or in combination. Controller 474 may be an external controller (e.g., in a separate die from the memory array 406, whether wholly or in part) or an internal controller (e.g., included in a same die as the memory array 406). For example, an internal controller might be a state machine or a memory sequencer.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:

an array of memory cells;

a differential amplifier having a first input and a second input, wherein the first input is connectable to a target voltage; and a capacitor coupled to the second input and configured to store an offset of the differential amplifier;

wherein the differential amplifier is configured to, during an operation to sense a data state of a memory cell of the array, reconnect the first input and the second input, wherein reconnecting the first input and the second input comprises switching a connection of transistors of the differential amplifier.

2. The apparatus of claim 1, wherein the first input is connected to the target voltage prior to the operation.

3. The apparatus of claim 1, wherein reconnecting the first input and the second input inputs the target voltage to the first input.

4. The apparatus of claim 1, wherein the first input is connectable to the target voltage via a switch.

5. The apparatus of claim 1, wherein:

an output of the differential amplifier is coupled to a data line of the array; and the memory cell is coupled to the data line.

6. The apparatus of claim 1, wherein:

the apparatus includes:

an additional differential amplifier having a first input and a second input, wherein the first input of the additional differential amplifier is connectable to the target voltage; and an additional capacitor coupled to the second input of the additional differential amplifier and configured to store an offset of the additional differential amplifier; and wherein the additional differential amplifier is configured to, during an operation to sense a data state of an additional memory cell of the array, reconnect the first input and the second input of the additional differential amplifier.

7. The apparatus of claim 1, wherein the memory cells of the array are ferroelectric random-access memory (FeRAM) cells.

8. A method of operating memory, comprising:

connecting a first input of a differential amplifier to a target voltage;

storing an offset of the differential amplifier in a capacitor coupled to a second input of the differential amplifier; and during an operation to sense a data state of a memory cell of the memory:

disconnecting the first input of the differential amplifier from the target voltage; and reconnecting the first input and the second input of the differential amplifier, wherein reconnecting the first input and the second input of the differential amplifier comprises switching a connection of transistors of the differential amplifier.

9. The method of claim 8, wherein reconnecting the first input and the second input of the differential amplifier comprises:

switching the first input from a noninverting input to an inverting input; and switching the second input from an inverting input to a noninverting input.

10. The method of claim 8, wherein the method includes inputting the offset of the differential amplifier to the second input of the different amplifier during the operation.

11. The method of claim 8, wherein the method includes:
connecting the capacitor to an output of the differential amplifier prior to the operation; and
disconnecting the capacitor from the output of the differential amplifier during the operation.

12. An apparatus, comprising:
an array of memory cells;
a differential amplifier having a first input, a second input, and an output, wherein the first input is connectable to a target voltage;
a first capacitor coupled to the second input and configured to store an offset of the differential amplifier; and
a second capacitor connectable to the first input and coupled to the output;
wherein the differential amplifier is configured to, during an operation to sense a data state of a memory cell of the array, reconnect the first input and the second input such that the target voltage is input to the first input through the second capacitor, wherein reconnecting the first input and the second input comprises switching a connection of transistors of the differential amplifier.

13. The apparatus of claim 12, wherein the target voltage is input to the first input without the offset of the differential amplifier during the operation.

14. The apparatus of claim 12, wherein the second capacitor is connected to the first input during the operation.

15. The apparatus of claim 12, wherein the second capacitor is disconnected from the first input prior to the operation.

16. The apparatus of claim 12, wherein the second capacitor is connectable to the first input via a switch.

17. The apparatus of claim 12, wherein the first capacitor is connectable to the output of the differential amplifier.

18. The apparatus of claim 12, wherein a charge of the second capacitor during the operation indicates the data state of the memory cell.

19. The apparatus of claim 12, wherein:
the differential amplifier includes a first transistor, a second transistor, a third transistor, and a fourth transistor;
a gate of the first transistor is connected to a gate of the second transistor;
the gate of the first transistor and the gate of the second transistor are connected to a drain of the third transistor; and
switching the connection of the transistors of the differential amplifier comprises switching the connection of the gate of the first transistor and the gate of the second transistor from the drain of the third transistor to a drain of the fourth transistor.

* * * * *